(12) United States Patent
Sakaida et al.

(10) Patent No.: US 9,165,781 B2
(45) Date of Patent: Oct. 20, 2015

(54) COMPOSITION FOR FORMING PATTERN REVERSAL FILM AND METHOD FOR FORMING REVERSAL PATTERN

(75) Inventors: Yasushi Sakaida, Toyama (JP); Hiroaki Yaguchi, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 114 days.

(21) Appl. No.: 14/008,820
(22) PCT Filed: Feb. 24, 2012
(86) PCT No.: PCT/JP2012/054587
§ 371 (c)(1),
(2), (4) Date: Sep. 30, 2013

(87) PCT Pub. No.: WO2012/132686
PCT Pub. Date: Oct. 4, 2012

(65) Prior Publication Data
US 2014/0017896 A1 Jan. 16, 2014

(30) Foreign Application Priority Data

Mar. 28, 2011 (JP) ................................ 2011-069889

(51) Int. Cl.
*H01L 21/311* (2006.01)
*H01L 21/308* (2006.01)
(Continued)

(52) U.S. Cl.
CPC ............ *H01L 21/3081* (2013.01); *C08G 77/20* (2013.01);
(Continued)

(58) Field of Classification Search
CPC ..... C08G 77/20; G03F 7/405; H01L 21/0337; H01L 21/3081
USPC .......... 524/291, 296, 321; 521/47.5; 438/694, 438/725; 216/42, 49
See application file for complete search history.

(56) References Cited

U.S. PATENT DOCUMENTS

2012/0045899 A1* 2/2012 Maruyama et al. ........... 438/694

FOREIGN PATENT DOCUMENTS

JP    A-5-267253    10/1993
JP    A-2002-110510    4/2002
(Continued)

OTHER PUBLICATIONS

Written Opinion of the International Searching Authority issued in International Application No. PCT/JP2012/054587 dated Apr. 10, 2012.

(Continued)

*Primary Examiner* — Binh X Tran
(74) *Attorney, Agent, or Firm* — Oliff PLC

(57) ABSTRACT

There is provided a silicon-containing composition for forming a pattern reversal film that can be reworked by an organic solvent that is normally used for the removal of resist patterns. A composition for forming a pattern reversal film, characterized by comprising: polysiloxane; an additive; and an organic solvent, wherein the polysiloxane has a structural unit of Formula (1) and a structural unit of Formula (2):

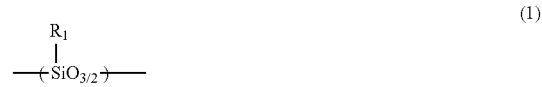

(where $R_1$ is a $C_{1-8}$ alkyl group), and

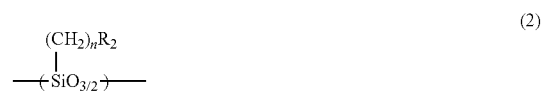

(where $R_2$ is an acryloyloxy group or a methacryloyloxy group; and n is an integer of 2 to 4), and the additive is an organic acid having at least two of a carboxy group and/or a hydroxy group; and a pattern reversal film and a method for forming a reversal pattern by use of the composition.

7 Claims, 2 Drawing Sheets

(51) Int. Cl.
*C08G 77/20* (2006.01)
*C09D 183/06* (2006.01)
*H01L 21/033* (2006.01)
*G03F 7/075* (2006.01)
*G03F 7/40* (2006.01)
*C08K 5/09* (2006.01)

(52) U.S. Cl.
CPC ............ *C09D 183/06* (2013.01); *G03F 7/0752* (2013.01); *G03F 7/405* (2013.01); *H01L 21/0337* (2013.01); *C08K 5/09* (2013.01)

(56) References Cited

FOREIGN PATENT DOCUMENTS

| | | |
|---|---|---|
| JP | A-2010-20109 | 1/2010 |
| JP | A-2010-151924 | 7/2010 |
| WO | WO 2010/010928 A1 | 1/2010 |
| WO | WO 2010/123032 A1 | 10/2010 |
| WO | WO 2010123032 A1 * | 10/2010 |

OTHER PUBLICATIONS

International Search Report issued in International Application No. PCT/JP2012/054587 dated Apr. 10, 2012.

* cited by examiner

COMPOSITION FOR FORMING PATTERN REVERSAL FILM AND METHOD FOR FORMING REVERSAL PATTERN

TECHNICAL FIELD

The present invention relates to a composition for forming a pattern reversal film and a method for forming a reversal pattern using the composition. More specifically, the present invention provides a composition for forming a pattern reversal film that can form a reversal pattern capable of being removed with an organic solvent.

BACKGROUND ART

In the semiconductor device manufacturing process, photoresist patterns are formed through photoresist application, pre-baking, exposure, post-baking, and resist development processes.

In recent years, along with the advancement of high integration of the semiconductor devices, there is an increasing demand for reducing the size of the above photoresist patterns, and a method for forming a reversal mask pattern as a pattern forming method aiming at high-precision size control and a resin composition for pattern reversal for use in forming the reversal mask pattern are developed (Patent Document 1 and Patent Document 2).

PRIOR ART DOCUMENTS

Patent Documents

Patent Document 1: Japanese Patent Application Publication No. H05-267253 (JP H05-267253 A)
Patent Document 2: Japanese Patent Application Publication No. 2002-110510 (JP 2002-110510 A)

SUMMARY OF THE INVENTION

Problem to be Solved by the Invention

In the formation of a photoresist pattern, the occurrence of defective patterns cannot be avoided more or less, and in this case, recycling and reusing (hereinafter called "reworking") substrates on which defective patterns are formed are being performed by ashing (oxygen plasma) treatment, chemical (resist remover) treatment, or the like.

Also in the above reversal mask pattern, a reworking property (that is, reworkable or easy-to-rework property) is demanded, but because reversal pattern materials so far developed contain silicon atoms, any attempts to perform ashing treatment cause alteration and hardening to silicon oxide, which makes removal impossible. Because a cross-liking reaction proceeds in the pattern through baking treatment, removal by chemical treatment using a conventional resist remover is also difficult.

An object of the present invention is to provide a silicon-containing composition for forming a pattern reversal film that can be reworked by an organic solvent that is normally used for the removal of resist patterns.

Means for Solving the Problem

The inventors of the present invention, as a result of earnest study for achieving the above object, have found that a composition containing polysiloxane having a specific structural unit and a specific additive is composed, thereby obtaining a composition for forming a pattern reversal film that enables a reversal pattern to be removed by chemical treatment using an organic solvent without using any special chemicals, and have achieved the present invention.

The present invention relates to, as a first aspect, a composition for forming a pattern reversal film, characterized by comprising: polysiloxane; an additive; and an organic solvent, where the polysiloxane has a structural unit of Formula (1) and a structural unit of Formula (2):

(where $R_1$ is a $C_{1-8}$ alkyl group), and

(where $R_2$ is an acryloyloxy group or a methacryloyloxy group; and n is an integer of 2 to 4), and the additive is an organic acid having at least two of a carboxy group and/or a hydroxy group.

The present invention relates to, as a second aspect, the composition for forming a pattern reversal film according to the first aspect, where the additive is an organic acid selected from the group consisting of maleic acid, citric acid, salicylic acid, 3-hydroxybenzoic acid, 4-hydroxybenzoic acid, 2,6-dihydroxybenzoic acid, 3,5-dihydroxybenzoic acid, gallic acid, phthalic acid, pyromellitic acid, and ascorbic acid.

The present invention relates to, as a third aspect, the composition for forming a pattern reversal film according to the first or second aspect, where the organic solvent is selected from $C_{2-10}$ alcohols.

The present invention relates to, as a fourth aspect, the composition for forming a pattern reversal film according to the any one of the first aspect to third aspects, characterized in that the polysiloxane contains the structural unit of Formula (1) and the structural unit of Formula (2) in a molar ratio of 50:50 to 99:1.

The present invention relates to, as a fifth aspect, a method for forming a reversal pattern, the method comprising: forming a resist pattern on a substrate to be treated; applying the composition for forming a pattern reversal film as described in any one of the first aspect to the fourth aspect so as to cover the pattern of the resist pattern, heating the composition at a temperature of 80° C. to 180° C., and forming a pattern reversal film; etch-backing the pattern reversal film and exposing the surface of the resist pattern; and removing the resist pattern and forming a reversal pattern.

The present invention relates to, as a sixth aspect, a method for removing a pattern reversal film, the method comprising peeling a pattern reversal film obtained by covering a resist pattern on a substrate to be treated with the composition for forming a pattern reversal film as described in any one of the first aspect to the fourth aspect and by heating the composition, together with the resist pattern using an organic solvent.

The present invention relates to, as a seventh aspect, the method for removing a pattern reversal film according to the sixth aspect, where the organic solvent is one or two or more selected from the group consisting of propylene glycol monomethyl ether, propylene glycol monomethyl ether acetate, ethyl lactate, and cyclohexanone.

Effects of the Invention

The composition for forming a pattern reversal film of the present invention can form a pattern reversal film that can be removed with an organic solvent. The composition for forming a pattern reversal film of the present invention in particular can form a pattern reversal film that can be removed using general-purpose organic solvents such as a combined solvent of propylene glycol monomethyl ether and propylene glycol monomethyl ether acetate.

For this reason, a pattern reversal film obtained by the composition for forming a pattern reversal film of the present invention can be easily removed from a substrate, when defects during film formation and defects in a reversal pattern formed from the pattern reversal film are created. The substrate can be recycled or reused, and the present invention can contribute to a reduction in the cost of the semiconductor manufacturing process. Furthermore, as a matter of course, the composition for forming a pattern reversal film of the present invention can form a film that satisfies requirements as the pattern reversal film.

Consequently, the composition for forming a pattern reversal film of the present invention can be used extremely advantageously in the manufacture of LSIs for which further size reduction is expected to proceed in the future.

MODES FOR CARRYING OUT THE INVENTION

Figure 1:
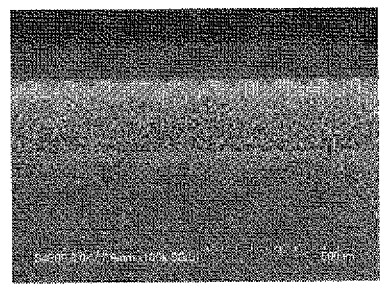
FIG. 1 is a picture showing a sectional SEM image of a resist pattern on a silicon substrate with an organic underlayer film formed.

The following describes an embodiment of the present invention in detail.
[Composition for Forming Pattern Reversal Film]
<Polysiloxane>

The polysiloxane contained in the composition for forming a pattern reversal film of the present invention is polysiloxane having a structural unit of Formula (1) and a structural unit of Formula (2):

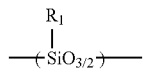

(1)

(where $R_1$ is a $C_{1-8}$ alkyl group), and

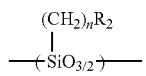

(2)

(where $R_2$ is an acryloyloxy group or a methacryloyloxy group; and n is an integer of 2 to 4).

Examples of $R_1$ in Formula (1) include a methyl group, an ethyl group, a n-propyl group, an isopropyl group, a n-butyl group, an isobutyl group, a tert-butyl group, a pentyl group, a heptyl group, a hexyl group, an octyl group, and a cyclohexyl group. $R_1$ is preferably a methyl group or an ethyl group.

In the polysiloxane, the ratio of the structural unit of Formula (1) and the structural unit of Formula (2) is preferably 50:50 to 99:1 in a molar ratio, and in particular, preferably 70:30 to 95:5.

The structural unit of Formula (1) and the structural unit of Formula (2) may form any structure out of a random copolymer, a block copolymer, and an alternating copolymer.

The polysiloxane contained in the composition for forming a pattern reversal film of the present invention is obtained by, for example, subjecting a silane compound of Formula (3) below and a silane compound of Formula (4) below to a cohydrolysis-condensation reaction.

(3)

(where $R_1$ is the same definition as in Formula (1); and $R_3$ are each independently a $C_{1-4}$ alkyl group.)

(4)

(where $R_2$ and n are the same definition as in Formula (2); and $R_4$ are each independently a $C_{1-4}$ alkyl group.)

Examples of the $C_{1-4}$ alkyl group in the silane compounds of Formula (3) and Formula (4) include a methyl group, an ethyl group, a n-propyl group, an isopropyl group, a n-butyl group, an isobutyl group, and a tert-butyl group. The $C_{1-4}$ alkyl group is preferably a methyl group or an ethyl group.

In Formula (3) and Formula (4), $R_3$ and $R_4$ may be each all the same or partially different.

Specific examples of the silane compound of Formula (3) include: methyltrialkoxysilane such as methyltrimethoxysilane, methyltriethoxysilane, methyltri-n-propoxysilane, methyltriisopropoxysilane, methyltri-n-butoxysilane, methyltriisobutoxysilane, and methyltri-tert-butoxysilane; and ethyltrialkoxysilane such as ethyltrimethoxysilane, ethyltriethoxysilane, ethyltri-n-propoxysilane, ethyltriisopropoxysilane, ethyltri-n-butoxysilane, ethyltriisobutoxysilane, and ethyltri-tert-butoxysilane. Among these, methyltrimethoxysilane and methyltriethoxysilane are preferred.

With regard to these silane compounds of Formula (3), one of them may be used singly, or two or more of them may be used in combination.

Specific examples of the silane compound of Formula (4) include 3-acryloyloxypropyltrimethoxysilane, 3-acryloyloxypropyltriethoxysilane, 3-methacryloyloxypropyltrimethoxysilane, 3-methacryloyloxypropyltriethoxysilane, 2-acryloyloxyethyltrimethoxysilane, 2-acryloyloxyethyltriethoxysilane, 2-methacryloyloxyethyltrimethoxysilane, and 2-methacryloyloxyethyltriethoxysilane.

Among these, 3-methacryloyloxypropyltrimethoxysilane and 3-methacryloyloxypropyltriethoxysilane are preferred.

With regard to these silane compounds of Formula (4), one of them may be used singly, or two or more of them may be used in combination.

The cohydrolysis-condensation reaction of the silane compound of Formula (3) and the silane compound of Formula (4) is generally performed in the presence of a basic catalyst such as an organic base and an inorganic base. Preferred examples of the catalyst include potassium hydroxide, cesium hydroxide, ammonium hydroxide, tetramethyl ammonium hydroxide, tetrabutyl ammonium hydroxide, and a phosphazene base (for example, a phosphazene base $P_4$-t-Bu solution).

The amount of the basic catalyst to be used is generally 0.001 parts by mass to 1 part by mass with respect to the entire 100 parts by mass of the silane compound of Formula (3) and the silane compound of Formula (4).

The cohydrolysis-condensation reaction is performed, for example, under the temperature condition of 60° C. to 80° C.

The concentration of the polysiloxane in the composition for forming a pattern reversal film of the present invention can be appropriately adjusted, which can be, for example, 1% by mass to 30% by mass, and in particular, 5% by mass to 20% by mass.

<Additive>

The additive contained in the composition for forming a pattern reversal film of the present invention is an organic acid having at least two of a carboxy group and/or a hydroxy group.

The additive is preferably an organic acid selected from the group consisting of maleic acid, citric acid, salicylic acid, 3-hydroxybenzoic acid, 4-hydroxybenzoic acid, 2,6-dihydroxybenzoic acid, 3,5-dihydroxybenzoic acid, gallic acid, phthalic acid, pyromellitic acid, and ascorbic acid.

The amount of use of the additive in the composition for forming a pattern reversal film of the present invention is, for example, 0.01% by mass to 10% by mass with respect to the mass of the polysiloxane (solid content), preferably 0.1% by mass to 5% by mass.

<Organic Solvent>

The organic solvent contained in the composition for forming a pattern reversal film of the present invention can dissolve the organic acid as the additive and is preferably selected from $C_{2-10}$ alcohols. When an organic solvent that does not dissolve the organic acid is used, the effects of the present invention may not be achieved satisfactorily. The organic solvent may further contain a resist solvent to the extent that intermixing with a resist pattern does not occur.

The $C_{2-10}$ alcohols may be any of straight-chain, branched-chain, and cyclic ones, and examples of them include ethanol, 1-propanol, 2-propanol, ethylene glycol, propylene glycol, glycerin, 1-butanol, 2-butanol, 2-methyl-1-propanol, 2-methyl-2-propanol, 1,4-butanediol, pentanol, 1-methyl-1-butanol, 2-methyl-1-butanol, 3-methyl-1-butanol, cyclopentanol, hexanol, 4-methyl-2-pentanol, cyclohexanol, heptanol, cycloheptanol, octyl alcohol, nonyl alcohol, decyl alcohol, diethylene glycol, dipropylene glycol, triethylene glycol tripropylene glycol, diethylene glycol monoethyl ether, triethylene glycol monomethyl ether, 4-methoxy-1-butanol, propylene glycol monomethyl ether, propylene glycol monoethyl ether, propylene glycol monopropyl ether, propylene glycol monobutyl ether, and propylene glycol monophenyl ether.

<Other Additives>

The composition for forming a pattern reversal film of the present invention may contain, if desired, various kinds of additives such as surfactants.

The surfactant is an additive for improving the applicability of the composition for forming a pattern reversal film. Known surfactants such as nonionic surfactants and fluorine-based surfactants may be used and may be added to the composition for forming a pattern reversal film of the present invention in a ratio of, for example, 0.01% by mass or more and 0.5% by mass or less, for example, 0.2% by mass or less, preferably 0.1% by mass or less.

Specific examples of the surfactants include: nonionic surfactants such as polyoxyethylene alkyl ethers including polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP [registered trademark] EF301, EF303, and EF352 (manufactured by Mitsubishi Materials Electronic Chemicals Co., Ltd. (former JEMCO, Inc.)), MEGAFAC [registered trademark] F171, F173, and R-30 (manufactured by DIC Corporation), FLUORAD FC430, and FC431 (manufactured by Sumitomo 3M Ltd.), ASAHI GUARD [registered trademark] AG710, SURFLON [registered trademark S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.).

With regard to these surfactants, one of them may be added singly, or two or more of them may be added in combination.

[Method for Forming Pattern Reversal Film]

A method for forming a pattern reversal film using the composition for forming a pattern reversal film of the present invention is a method including: applying the composition for forming a pattern reversal film onto a substrate; baking at a temperature of 80° C. to 180° C., and forming a film.

With regard to the substrate, a semiconductor substrate such as a silicon substrate is used, and a stepped substrate with a resist pattern formed on its surface is used.

[Method for Forming Reversal Pattern]

The method for forming a reversal pattern of the present invention includes: (a) forming a resist pattern on a substrate to be treated; (b) applying the composition for forming a pattern reversal film onto the substrate so as to cover the resist pattern, heating the composition at a temperature of 80° C. to 180° C., and forming a pattern reversal film; (c) etch-backing the pattern reversal film and exposing the surface of the resist pattern; and (d) removing the resist pattern and forming a reversal pattern.

In (a) forming of a resist pattern on a substrate to be treated, first, a resist material is applied onto the substrate to be treated by an appropriate method such as a spinner and coater and dried at a temperature of generally 80° C. to 180° C. to form a resist film. The film thickness of the resist is generally 10 nm to 1000 nm.

Thereafter, the resist film is exposed using a light source such as visible rays, ultraviolet rays, and X-rays through a mask with a predetermined pattern, and the exposed part is developed with a developer. Post exposure bake (PEB) is performed as needed to form a predetermined resist pattern.

With regard to the substrate to be treated, a substrate used for the manufacture of precision integrated circuit devices may be used (for example, a semiconductor substrate such as silicon substrate covered with a silicon oxide film, a silicon nitride film, or a silicon oxynitride film, a silicon nitride substrate, a quartz substrate, a glass substrate (including non-alkali glass, low-alkali glass, and crystallized glass), and a glass substrate on which an ITO film is formed).

If desired, an organic or inorganic underlayer film having an anti-reflective property may be formed in advance on the substrate to be treated.

With regard to the resist material, both negative type and positive type ones may be used. Examples of the resist material include a positive type resist including a novolac resin and 1,2-naphtoquinone diazide sulfonate, a chemically amplified resist including an photoacid generator and a binder having a group that decomposes by an acid so as to increase the alkali dissolution rate, a chemically amplified resist including an photoacid generator and an alkali-soluble binder and a low-molecular compound that decomposes by an acid so as to increase the alkali dissolution rate of the resist, and a chemically amplified resist including an photoacid generator and a binder having a group that decomposes by an acid so as to increase the alkali dissolution rate and a low-molecular compound that decomposes by an acid to increase the alkali dissolution rate of the resist. Examples of the resist material include PAR710 and PAR855 (trade name, manufactured by Sumitomo Chemical Co., Ltd.) and AR2772JN (trade name, manufactured by JSR Corporation).

With regard to the developer for the resist, an aqueous solution of alkalis may be used, and examples of alkalis include: inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethyl ammonium hydroxide, tetraethyl ammonium hydroxide, and choline; and cyclic amines such as pyrrole and piperidine. The aqueous solution of alkalis may be used with an appropriate amount of alcohols such as isopropyl alcohol and surfactants such as a nonionic one added. A preferred developer among these is an aqueous solution of a quaternary ammonium salt, more preferably an aqueous solution of tetramethylammonium hydroxide.

After the resist film is developed with the developer including the alkali aqueous solution, washing with water and drying are generally performed for the later processes.

In subsequently performed (b) applying of the composition for forming a pattern reversal film onto the substrate so as to cover the resist pattern and forming a pattern reversal film, the composition for forming a pattern reversal film is applied onto the substrate with the resist pattern formed on its surface (stepped substrate) by an appropriate application method such as a spinner and a coater. Baking at a temperature of 80° C. to 180° C. is then performed to form the pattern reversal film.

Baking at a temperature of preferably 80° C. to 150° C. can volatilize an organic solvent within the applied film promptly. The baking time is generally 10 seconds to 300 seconds, preferably 30 seconds to 180 seconds.

The film thickness of the pattern reversal film, which is not limited in particular, is generally 10 nm to 1000 nm, preferably 50 nm to 500 nm.

Thereafter, (c) etch-backing of the pattern reversal film and exposing the surface of the resist pattern and (d) removing of the resist pattern and forming a reversal pattern are performed. Specifically, etch-back treatment is performed on the pattern reversal film formed as described above to the extent that the surface of the resist pattern is exposed, and the resist pattern is then removed by, for example, $O_2$ etching (ashing) to form a desired reversal pattern.

With regard to the etch-back treatment, examples thereof include dry etching using a fluorine-based gas such as $CF_4$, wet etching using an aqueous solution of an organic acid or an organic base or an organic solvent, and the CMP method, and the treatment conditions can be appropriately adjusted.

For the removal of the resist pattern, any known dry etching apparatus may be used, and the treatment conditions can be appropriately adjusted.

[Method for Removing Pattern Reversal Film]

The pattern reversal film of the present invention, in other words, the pattern reversal film obtained by covering the resist pattern on the substrate to be treated and heating can be removed from the substrate to be treated together with the resist pattern using an organic solvent that is normally used for the removal of resist patterns. The present invention is also directed to a method for removing the pattern reversal film. After forming a reversal pattern from the pattern reversal film, only the reversal pattern may be removed.

The organic solvent used as a remover here, which is not limited in particular, can be appropriately selected in accordance with the composition for forming a pattern reversal film and the resist material used.

In the present invention, examples of the organic solvent used as the remover for use in the removal of the pattern reversal film include: sulfoxides such as dimethyl sulfoxide (DMSO); sulfones such as dimethyl sulfone, diethyl sulfone, bis(2-hydroxyethylene)sulfone, tetramethylene sulfone, and sulfolane; amides such as N,N-dimethylformamide, N-methylformamide, N,N-dimethylacetamide, N-methylacetamide, and N,N-diethylacetamide; lactams such as N-ethyl-2-pyrrolidone, N-propyl-2-pyrrolidone, N-hydroxymethyl-2-pyrrolidone, and N-hydroxyethyl-2-pyrrolidone; lactones such as β-propiolactone, γ-butyrolactone, γ-valerolactone, δ-valerolactone, γ-caprolactone, and ε-caprolactone; imidazolidinones such as 1,3-dimethyl-2-imidazolidinone, 1,3-diethyl-2-imidazolidinone, and 1,3-diisopropyl-2-imidazolidinone; polyhydric alcohols such as ethylene glycol, ethylene glycol monomethyl ether, ethylene glycol monoethyl ether, ethylene glycol monobutyl ether, diethylene glycol, diethylene glycol monomethyl ether, diethylene glycol monoethyl ether, diethylene glycol monobutyl ether, propylene glycol, propylene glycol monomethyl ether, dipropylene glycol monomethyl ether, glycerin, 1,2-butylene 1,3-butylene glycol, and 2,3-butylene glycol; ester ethers such as ethylene glycol monomethyl ether acetate, ethylene glycol monoethyl ether acetate, and propylene glycol monomethyl ether acetate; ethyl lactate; and cyclohexanone.

Among these, preferred organic solvents are dimethyl sulfoxide, dimethyl imidazolidinone, dimethylacetamide, sulfolane, γ-butyrolactone, propylene glycol monomethyl ether, propylene glycol monomethyl ether acetate, dipropylene glycol monomethyl ether, ethyl lactate, and cyclohexanone. The most preferred organic solvents are propylene glycol monomethyl ether, propylene glycol monomethyl ether acetate, ethyl lactate, and cyclohexanone, or any combination of two or more of them.

EXAMPLES

The following describes the present invention in detail with reference to examples. However, the present invention is not limited to these examples. The expressions "parts" and "%" in the description of these examples are based on mass unless otherwise specifically described.

The weight-average molecular weights shown in the following synthesis examples of the present specification are measurement results by gel permeation chromatography (hereinafter abbreviated as GPC). A measurement apparatus, measurement conditions, and the like are as follows:

[GPC Conditions]
GPC apparatus: HLC-8220GPC (manufactured by Tosoh Corporation)
GPC column: Shodex [registered trademark] KF803L, KF802, and KF801 (manufactured by Showa Denko K. K.)
Column temperature: 40° C.
Solvent Tetrahydrofuran (THF)
Flow rate: 1.0 mL/min.
Standard sample: Polystyrene (manufactured by Showa Denko K. K.)

Synthesis Examples 1 to 3

Preparation of Resin 1 to 3 for Use in Composition for Forming a Pattern Reversal Film Synthesis Example 1

Synthesis of poly(methyl-co-3-methacryloyloxypropyl)silsesquioxane: $[(methyl)SiO_{3/2}]_{0.80}[(methacryloyloxypropyl)SiO_{3/2}]_{0.20}$ 80 g of toluene, 0.10 mol of 3-methacryloyloxypropyltrimethoxysilane, 0.40 mol of methyltrimethoxysilane, 2.40 mol of water, 1 g of an aqueous cesium hydroxide solution (50% by mass), 200 g of methanol, and 40 mg of 2,6-di-tert-butyl-4-methylphenol were charged into a flask to prepare a transparent solution. The solution was refluxed for 1 hour with stirring to remove the solvent (mainly methanol). The reflux was further continued, and toluene of the same amount as the removed solvent was added in order to maintain a constant solvent concentration. After most of methanol was removed, the solution became turbid. After the reflux was further continued and the solvent was removed continuously, the solution became transparent again when most of water was removed.

Next, the temperature was increased to about 105° C. slowly over about 1 hour. Thereafter, the resultant transparent solution was cooled, and about 230 g of toluene was added thereto. 3 g of acetic acid was added thereto, and the mixture was stirred for 0.5 hours. The resultant solution was washed with 100 mL of desalted water three times. The solution was then filtered with filter paper with a pour size of 1 μm. The resultant filtrate was charged into a 50° C. rotary evaporator to remove toluene. The resultant product (solid resin) was dried under vacuum at room temperature for 2 hours to obtain Resin 1. The weight-average molecular weight (Mw) of Resin 1 was 26,000.

Synthesis Example 2

Synthesis of poly(methyl-co-3-methacryloyloxypropyl)silsesquioxane: $[(methyl)SiO_{3/2}]_{0.80}[(methacryloyloxypropyl)SiO_{3/2}]_{0.20}$ 80 g of toluene, 0.10 mol of 3-methacryloyloxypropyltrimethoxysilane, 0.40 mol of methyltrimethoxysilane, 2.40 mol of water, 0.5 g of an aqueous cesium hydroxide solution (50% by mass), 300 g of methanol, and 50 mg of 2,6-di-tert-butyl-4-methylphenol were charged into a flask to prepare a transparent solution. The solution was refluxed for 1 hour with stirring to remove the solvent (mainly methanol). The reflux was further continued, and toluene of the same amount as the removed solvent was added in order to maintain a constant solvent concentration. After most of methanol was removed, the solution became turbid. After the reflux was further continued and the solvent was removed continuously, the solution became transparent again when most of water was removed.

Next, the temperature was increased to about 105° C. slowly over about 1 hour. Thereafter, the resultant transparent solution was cooled, and about 330 g of toluene was added thereto. 3 g of acetic acid was added thereto, and the mixture was stirred for 0.5 hours. The resultant solution was washed with 100 mL of desalted water once. The resultant solution was then filtered with filter paper with a pour size of The resultant filtrate was charged into a 50° C. rotary evaporator to remove toluene. The resultant product (solid resin) was dried under vacuum at room temperature for 2 hours to obtain Resin 2. The weight-average molecular weight (Mw) of Resin 2 was 13,000.

Synthesis Example 3

Synthesis of Resin 3: TEOS/MTEOS/PTMOS (65/30/5)

27.08 g (65% by mole) of tetraethoxysilane, 10.70 g (30% by mole) of methyltriethoxysilane, 1.98 g (5% by mole) of phenyltrimethoxysilane, and 59.65 g of acetone were charged into a flask. A cooling pipe was attached to this flask, and a dropping funnel was set into which 13.15 g of an aqueous hydrochloric acid solution (0.01 mol/L) separately prepared was charged. At room temperature, the aqueous hydrochloric acid solution was added dropwise slowly, and the mixture was stirred for several minutes. The mixture was caused to react in an oil bath at 85° C. for 4 hours. After the termination of the reaction, the flask containing the reaction liquid was left to be cooled and then attached to an evaporator to remove ethanol generated during the reaction, thereby obtaining a reaction product (polysiloxane). Furthermore, acetone was replaced with 4-methyl-2-pentanol using an evaporator to obtain a solution of Resin 3. The solid content concentration of the obtained Resin 3 was 25% by mass as a result of the measurement by the baking method. The weight-average molecular weight (Mw) of the obtained Resin 3 was 2,000. Resin 3 obtained in the present synthesis example does not fall under the polysiloxane having a structural unit of Formula (1) and a structural unit of Formula (2).

Examples 1 to 18, Comparative Examples 1 to 9

Preparation of Composition for Forming Pattern Reversal Film

Example 1

Resin 1/Ascorbic Acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of ascorbic acid and 100 g of 4-methyl-2-pentanol were added to the solution, and the solution was filtered with a filter with a pore size of 0.1 μm to obtain a composition for forming a pattern reversal film.

Example 2

Resin 1/Maleic Acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of maleic acid and 75 g of 4-methyl-2-pentanol were added to the solution, and the solution was filtered with a filter with a pore size of 0.1 μm to obtain a composition for forming a pattern reversal film.

Example 3

Resin 1/Salicylic Acid (Additive Amount: 0.5% by Mass)

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of salicylic acid and 75 g of 4-methyl-2-pentanol were added to the solution, and the solution was filtered with a filter with a pore size of 0.1 μm to obtain a composition for forming a pattern reversal film.

Example 4

Resin 1/3-hydroxybenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 3-hydroxybenzoic acid and 75 g of 4-methyl-2-pentanol were added to the solution, and the solution was filtered with a filter with a pore size of 0.1 μm to obtain a composition for forming a pattern reversal film.

Example 5

Resin 1/4-hydroxybenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 4-hydroxybenzoic acid and 75 g of 4-methyl-2-pentanol were added to the solution, and the solution was filtered with a filter with a pore size of 0.1 μm to obtain a composition for forming a pattern reversal film.

Example 6

Resin 1/2,6-dihydroxybenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 2,6-dihydroxybenzoic acid and 75 g of 4-methyl-2-pentanol were added to the solution, and the solution was filtered with a filter with a pore size of 0.1 μm to obtain a composition for forming a pattern reversal film.

Example 7

Resin 1/3,5-dihydroxybenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 3,5-dihydroxybenzoic acid and 75 g of 4-methyl-2-pentanol were added to the solution, and the solution was filtered with a filter with a pore size of 0.1 μm to obtain a composition for forming a pattern reversal film.

Example 8

Resin 1/3,4,5-trihydroxybenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 3,4,5-trihydroxybenzoic acid and 75 g of 4-methyl-2-pentanol were added to the solution, and the solution was filtered with a filter with a pore size of 0.1 μm to obtain a composition for forming a pattern reversal film.

Example 9

Resin 1/phthalic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of phthalic acid and 75 g of 4-methyl-2-pentanol were added to the solution, and the solution was filtered with a filter with a pore size of 0.1 μm to obtain a composition for forming a pattern reversal film.

Example 10

Resin 1/1,2,4,5-benzene tetracarboxylic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 1,2,4,5-benzene tetracarboxylic acid and 75 g of 4-methyl-2-pentanol were added to the solution, and the solution was filtered with a filter with a pore size of 0.1 μm to obtain a composition for forming a pattern reversal film.

Example 11

Resin 1/Citric Acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of citric acid and 75 g of 4-methyl-2-pentanol were added to the solution, and the solution was filtered with a filter with a pore size of 0.1 μm to obtain a composition for forming a pattern reversal film.

Example 12

Resin 1/Salicylic Acid (Additive Amount: 0.1% by Mass)

A 10% by mass solution was obtained using 5 g of Resin 1 (polymer) obtained in Synthesis Example 1 and 45 g of 4-methyl-2-pentanol. 0.005 g (0.1% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 13

Resin 1/Salicylic Acid (Additive Amount: 0.25% by Mass)

A 10% by mass solution was obtained using 5 g of Resin 1 (polymer) obtained in Synthesis Example 1 and 45 g of 4-methyl-2-pentanol. 0.0125 g (0.25% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 14

Resin 1/Salicylic Acid (Additive Amount: 0.75% by Mass)

A 10% by mass solution was obtained using 5 g of Resin 1 (polymer) obtained in Synthesis Example 1 and 45 g of 4-methyl-2-pentanol. 0.0375 g (0.75% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 15

Resin 1/Salicylic Acid (Additive Amount: 1% by Mass)

A 10% by mass solution was obtained using 5 g of Resin 1 (polymer) obtained in Synthesis Example 1 and 45 g of 4-methyl-2-pentanol. 0.05 g (1% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 16

Resin 1/Salicylic Acid (Additive Amount: 3% by Mass)

A 10% by mass solution was obtained using 5 g of Resin 1 (polymer) obtained in Synthesis Example 1 and 45 g of 4-methyl-2-pentanol. 0.15 g (3% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 17

Resin 1/Salicylic Acid (Additive Amount: 5% by Mass)

A 10% by mass solution was obtained using 5 g of Resin 1 (polymer) obtained in Synthesis Example 1 and 45 g of 4-methyl-2-pentanol. 0.25 g (5% by mass with respect to the mass of Resin 1) of salicylic acid and 50 g of 4-methyl-2-pentanol were added to the solution, and the solution was filtered with a filter with a pore size of 0.1 μm to obtain a composition for forming a pattern reversal film.

Example 18

Resin 2/Ascorbic Acid

A 10% by mass solution was obtained using 5 g of Resin 2 (polymer) obtained in Synthesis Example 2 and 45 g of 4-methyl-2-pentanol. 0.025 g (0.5% by mass with respect to the mass of Resin 1) of ascorbic acid and 100 g of 4-methyl-2-pentanol were added to the solution, and the solution was filtered with a filter with a pore size of 0.1 μm to obtain a composition for forming a pattern reversal film.

Comparative Example 1

Only Resin 1

A 3.5% by mass solution was obtained using 3.5 g of Resin 1 (polymer) obtained in Synthesis Example 1 and 96.5 g of 4-methyl-2-pentanol. The solution was filtered with a filter with a pore size of 0.1 μm to obtain a composition for forming a pattern reversal film.

Comparative Example 2

Resin 3/Salicylic Acid 0.0125 g (0.5% by mass with respect to the mass of Resin 3 (solid content)) of salicylic acid and 60 g of 4-methyl-2-pentanol were added to 10 g of a solution of Resin 3 (polymer) obtained in Synthesis Example 3, and the solution was filtered with a filter with a pore size of 0.1 μm to obtain a composition for forming a pattern reversal film.

Comparative Example 3

Resin 3/3-hydroxybenzoic acid 0.0125 g (0.5% by mass with respect to the mass of Resin 3 (solid content)) of 3-hydroxybenzoic acid and 60 g of 4-methyl-2-pentanol were added to 10 g of a solution of Resin 3 (polymer) obtained in Synthesis Example 3, and the solution was filtered with a filter with a pore size of 0.1 μm to obtain a composition for forming a pattern reversal film.

Comparative Example 4

Resin 1/Benzoic Acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of benzoic acid and 75 g of 4-methyl-2-pentanol were added to the solution, and the solution was filtered with a filter with a pore size of 0.1 μm to obtain a composition for forming a pattern reversal film. Benzoic acid used in the present comparative example does not fall under the organic acid having at least two of a carboxy group and/or a hydroxy group.

Comparative Example 5

Resin 1/4-methylbenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 4-methylbenzoic acid and 75 g of 4-methyl-2-pentanol were added to the solution, and the solution was filtered with a filter with a pore size of 0.1 μm to obtain a composition for forming a pattern reversal film. 4-Methylbenzoic acid used in the present comparative example does not fall under the organic acid having at least two of a carboxy group and/or a hydroxy group.

Comparative Example 6

Resin 1/4-bromobenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 4-bromobenzoic acid and 75 g of 4-methyl-2-pentanol were added to the solution, and the solution was filtered with a filter with a pore size of 0.1 μm to obtain a composition for forming a pattern reversal film. 4-Bromobenzoic acid used in the present comparative example does not fall under the organic acid having at least two of a carboxy group and/or a hydroxy group.

Comparative Example 7

Resin 1/4-aminobenzoic acid

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of 4-aminobenzoic acid and 75 g of 4-methyl-2-pentanol were added to the solution, and the solution was filtered with a filter with a pore size of 0.1 μm to obtain a composition for forming a pattern reversal film. 4-Aminobenzoic acid used in the present comparative example does not fall under the organic acid having at least two of a carboxy group and/or a hydroxy group.

Comparative Example 8

Resin 1/DL-α-tocopherol

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of tocopherol and 75 g of 4-methyl-2-pentanol were added to the solution, and the solution was filtered with a filter with a pore size of 0.1 μm to obtain a composition for forming a pattern reversal film. DL-α-tocopherol used in the present comparative example does not fall under the organic acid having at least two of a carboxy group and/or a hydroxy group.

Comparative Example 9

Resin 1/DL-α-tocopherol acetate

A 10% by mass solution was obtained using 5 g of Resin 1 (polymer) obtained in Synthesis Example 1 and 45 g of 4-methyl-2-pentanol. 0.025 g (0.5% by mass with respect to the mass of Resin 1) of tocopherol acetic ester and 75 g of 4-methyl-2-pentanol were added to the solution, and the solution was filtered with a filter with a pore size of 0.1 μm to obtain a composition for forming a pattern reversal film. DL-α-tocopherol acetate used in the present comparative example does not fall under the organic acid having at least two of a carboxy group and/or a hydroxy group.

[Performance Evaluation]

The following test was performed on each composition for forming a pattern reversal film of Examples 1 to 18 and Comparative Examples 1 to 9.

Each composition for forming a pattern reversal film of the above Examples and Comparative Examples was applied onto a silicon substrate and was baked at 110° C. for 60 seconds to obtain a pattern reversal film, and the film thickness was measured using a film thickness measurement apparatus (NanoSpec 6100 manufactured by Toho Technology Inc.) (the thickness after application).

Next, immersion treatment was performed using an organic solvent (propylene glycol monomethyl ether acetate (PGMEA): propylene glycol monomethyl ether (PGME)=7:3(mass ratio)) to perform a peel test on the pattern reversal film. Thereafter, the film thickness on the silicon substrate was measured in the same manner as the above (the film thickness after reworking treatment).

Because the measurement lower limit of the above film thickness measurement apparatus is not more than 10 nm, a result of film thickness measurement of not more than 10 nm was regarded as "not more than detection lower limit."

From the film thickness results after reworking treatment, reworkability was determined with a case of not more than detection lower limit expressed by ○ and a case in which the film thickness was measurable (the film thickness exceeding 10 nm) expressed by x.

Obtained results are shown in Table 1.

TABLE 1

| | Film thickness after application | Film thickness after reworking treatment | Reworkability |
|---|---|---|---|
| Example 1 | 103.3 nm | Not more than detection lower limit | ○ |
| Example 2 | 122.9 nm | Not more than detection lower limit | ○ |
| Example 3 | 122.2 nm | Not more than detection lower limit | ○ |
| Example 4 | 122.2 nm | Not more than detection lower limit | ○ |
| Example 5 | 121.8 nm | Not more than detection lower limit | ○ |
| Example 6 | 122.5 nm | Not more than detection lower limit | ○ |
| Example 7 | 122.5 nm | Not more than detection lower limit | ○ |
| Example 8 | 122.8 nm | Not more than detection lower limit | ○ |
| Example 9 | 122.1 nm | Not more than detection lower limit | ○ |
| Example 10 | 121.9 nm | Not more than detection lower limit | ○ |
| Example 11 | 122.8 nm | Not more than detection lower limit | ○ |
| Example 12 | 160.5 nm | Not more than detection lower limit | ○ |
| Example 13 | 160.5 nm | Not more than detection lower limit | ○ |
| Example 14 | 159.9 nm | Not more than detection lower limit | ○ |
| Example 15 | 158.9 nm | Not more than detection lower limit | ○ |

TABLE 1-continued

|  | Film thickness after application | Film thickness after reworking treatment | Reworkability |
| --- | --- | --- | --- |
| Example 16 | 155.8 nm | Not more than detection lower limit | ○ |
| Example 17 | 152.6 nm | Not more than detection lower limit | ○ |
| Example 18 | 120.1 nm | Not more than detection lower limit | ○ |
| Comparative Example 1 | 100.4 nm | 86.7 nm | x |
| Comparative Example 2 | 81.6 nm | 22.7 nm | x |
| Comparative Example 3 | 81.4 nm | 41.0 nm | x |
| Comparative Example 4 | 121.3 nm | 104.7 nm | x |
| Comparative Example 5 | 121.2 nm | 101.8 nm | x |
| Comparative Example 6 | 118.9 nm | 65.7 nm | x |
| Comparative Example 7 | 119.0 nm | 60.9 nm | x |
| Comparative Example 8 | 114.1 nm | 106.0 nm | x |
| Comparative Example 9 | 113.7 nm | 105.1 nm | x |

As shown in Table 1, it is confirmed that the composition for forming a pattern reversal film of the present invention can be removed with an organic solvent and is reworkable.

Patterning Example 1

Using Composition for Forming Pattern Reversal Film of the Present Invention

An ArF resist solution (PAR855, trade name, manufactured by Sumitomo Chemical Co., Ltd.) was applied onto a silicon substrate with an organic underlayer film with a film thickness of 200 nm formed using a spinner. Baking at 110° C. for 60 seconds on a hot plate formed a resist film with a film thickness of 100 nm. Using an exposure apparatus for ArF excimer laser (S307E manufactured by Nikon Corporation), exposure was performed under predetermined conditions. With 65 nm line and space as target line width, after the exposure, baking (PEB) was performed at 105° C. for 60 seconds, and then alkali development and rinse treatment were performed to form a resist pattern. For the obtained resist pattern, its sectional shape was imaged by an SEM. The obtained sectional SEM image is shown in FIG. 1.

Figure 2:
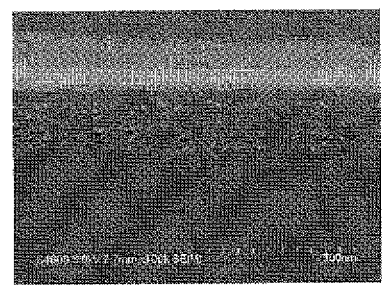
FIG. 2 is a picture showing a sectional SEM image of a pattern reversal film obtained by using the composition for forming a pattern reversal film obtained in Example 1.

The composition for forming a pattern reversal film obtained in Example 1 was applied onto the obtained resist pattern. By spinning at 1,500 rpm for 60 seconds, the organic solvent within the composition was spin-dried, and baking treatment was performed at 110° C. for 60 seconds to form a pattern reversal film. For the obtained pattern reversal film, its sectional shape was imaged by an SEM. The result is shown in FIG. 2.

Figure 3:
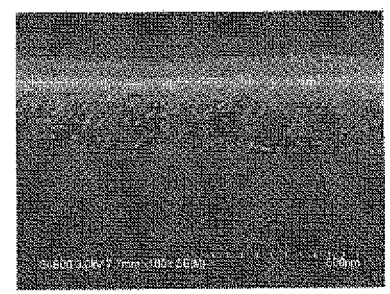
FIG. 3 is a picture showing a sectional SEM image of a resist pattern and a pattern reversal film with the upper part of the resist pattern exposed.
Figure 4:
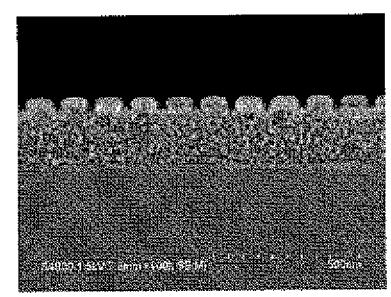
FIG. 4 is a picture showing a sectional SEM image of a reversal pattern obtained by using the composition for forming a pattern reversal film of Example 1.
Figure 5:
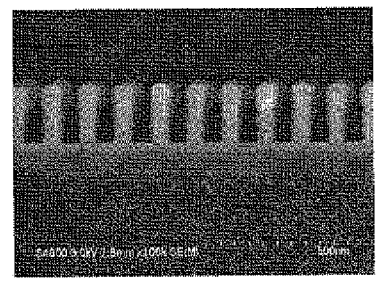
FIG. 5 is a picture showing a sectional SEM image of a result obtained by patterning the organic underlayer film with the obtained reversal pattern as an etching mask.

Next, using RIE-10NR (manufactured by SAMCO Inc.) as a dry etching apparatus, dry etching was performed under the conditions $CF_4/Ar=50/200$ sccm, 15 Pa, and 200 W to expose the upper part of the resist pattern. An SEM image observing the sectional shape of this state is shown in FIG. 3. Next, dry etching was performed under the conditions $O_2/N_2=10/20$ sccm, 1 Pa, and 300 W to remove the resist pattern and obtain a reversal pattern. A sectional SEM image of the sectional shape of the obtained reversal pattern is shown in FIG. 4. Thereafter, when dry etching was performed under the conditions $CF_4/Ar=50/200$ sccm, 15 Pa, and 200 W with the obtained reversal pattern as an etching mask, patterning on the organic underlayer film could be achieved. A sectional SEM image of the sectional shape as a result of the patterning is shown in FIG. 5.

Patterning Example 2

Using Composition for Forming Pattern Reversal Film of the Present Invention

Figure 6:
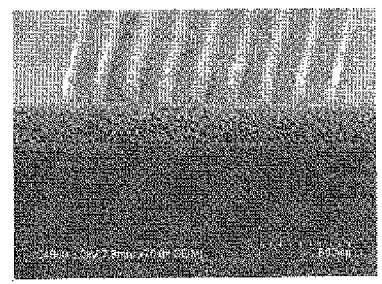
FIG. 6 is a picture showing a sectional SEM image of a resist pattern on a silicon substrate with an organic underlayer film formed.
Figure 7:
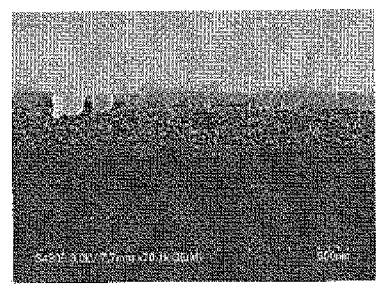
FIG. 7 is a picture showing a sectional SEM image of a resist pattern and a pattern reversal film with the upper part of the resist film exposed after forming a pattern reversal film using the composition for forming a pattern reversal film obtained in Example 18.
Figure 8:
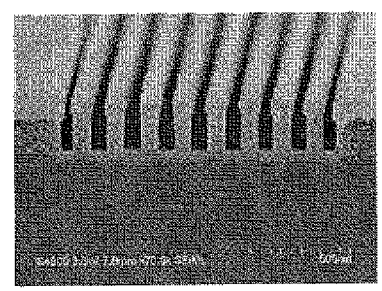
FIG. 8 is picture showing a sectional SEM image of a result obtained by patterning the organic underlayer film with a reversal pattern obtained by removing the resist pattern as an etching mask.

Based on the same method, apparatus, and conditions as Patterning Example 1, a resist pattern whose sectional image is shown in FIG. 6 was formed. Next, a pattern reversal film was formed on the resist pattern using the composition for forming a pattern reversal film obtained in Example 18, and dry etching was performed to expose the upper part of the resist pattern as shown in the sectional SEM image in FIG. 7. Then, dry etching was performed based on the same method, apparatus, and conditions as Patterning Example 1, and the resist pattern was removed to obtain a reversal pattern. Thereafter, when dry etching was performed with the reversal pattern as an etching mask, patterning on the organic underlayer film could be achieved. A sectional SEM image of the sectional shape as a result of the patterning is shown in FIG. 8.

As shown in <Patterning Example 1 Using Composition for Forming Pattern Reversal Film of the Present Invention> and <Patterning Example 2 Using Composition for Forming Pattern Reversal Film of the Present Invention>, it is confirmed that an objective reversal pattern can be formed using the composition for forming a pattern reversal film of the present invention.

The invention claimed is:

1. A composition for forming a pattern reversal film, comprising:
   a polysiloxane;
   an additive; and
   an organic solvent,
   wherein:
   the polysiloxane comprises structural units and terminal ends, the structural units consisting of one or more of a structural unit of Formula (1) and one or more of a structural unit of Formula (2):

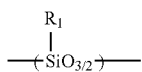

(1)

where $R_1$ is a $C_{1-8}$ alkyl group, and

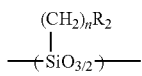

(2)

where $R_2$ is an acryloyloxy group or a methacryloyloxy group; and n is an integer of 2 to 4, and the additive is selected from the group consisting of maleic acid, citric acid, salicylic acid, 3-hydroxybenzoic acid, 4-hydroxybenzoic acid, 2,6-dihydroxybenzoic acid, 3,5-dihydroxybenzoic acid, gallic acid, phthalic acid, pyromellitic acid, and ascorbic acid.

2. The composition for forming a pattern reversal film according to claim 1, wherein the organic solvent is selected from $C_{2-10}$ alcohols.

3. The composition for forming a pattern reversal film according to claim 1, wherein the polysiloxane contains the structural unit of Formula (1) and the structural unit of Formula (2) in a molar ratio of 50:50 to 99:1.

4. The composition for forming a pattern reversal film according to claim 1, wherein an amount of the additive in the composition is 0.1% by mass to 5% by mass with respect to the mass of the polysiloxane.

5. A method for forming a reversal pattern, the method comprising:
    forming a resist pattern on a substrate to be treated;
    applying the composition for forming a pattern reversal film as claimed in claim 1 so as to cover the pattern of the resist pattern, heating the composition at a temperature of 80° C. to 180° C., and forming a pattern reversal film;
    etch-backing the pattern reversal film and exposing the surface of the resist pattern; and
    removing the resist pattern and forming a reversal pattern.

6. A method for removing a pattern reversal film, the method comprising:
    peeling a pattern reversal film obtained by covering a resist pattern on a substrate to be treated with the composition for forming a pattern reversal film as claimed in claim 1 and by heating the composition, together with the resist pattern using an organic solvent.

7. The method for removing a pattern reversal film according to claim 6, wherein the organic solvent is one or two or more selected from the group consisting of propylene glycol monomethyl ether, propylene glycol monomethyl ether acetate, ethyl lactate, and cyclohexanone.

* * * * *